(12) United States Patent
Gandhi

(10) Patent No.: US 7,236,897 B2
(45) Date of Patent: Jun. 26, 2007

(54) GROUP METERING SYSTEM FOR POWER METERS

(75) Inventor: Guljeet S. Gandhi, Noida (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/195,177

(22) Filed: Aug. 2, 2005

(65) Prior Publication Data

US 2006/0033488 A1 Feb. 16, 2006

Related U.S. Application Data

(60) Provisional application No. 60/600,232, filed on Aug. 10, 2004.

(51) Int. Cl.
*G01R 7/00* (2006.01)
(52) U.S. Cl. .................. 702/61; 702/60; 702/62; 324/74; 324/142; 705/14; 705/26; 705/27
(58) Field of Classification Search ............. 702/61, 702/62, 60; 324/74, 142; 705/26, 14, 27
See application file for complete search history.

(56) References Cited

U.S. PATENT DOCUMENTS

| 4,884,021 | A | 11/1989 | Hammond et al. | |
|---|---|---|---|---|
| 6,078,870 | A | 6/2000 | Windsheimer | |
| 6,671,635 | B1 * | 12/2003 | Forth et al. | 702/61 |
| 6,735,535 | B1 | 5/2004 | Kagan et al. | |
| 6,853,978 | B2 * | 2/2005 | Forth et al. | 705/26 |
| 2005/0143941 | A1 * | 6/2005 | Forth et al. | 702/61 |

FOREIGN PATENT DOCUMENTS

| EP | 0853364 A2 | 7/1998 |
|---|---|---|
| FR | 2775104 | 8/1999 |
| GB | 2157448 | 10/1985 |

* cited by examiner

*Primary Examiner*—John Barlow
*Assistant Examiner*—Hlen Vo
(74) *Attorney, Agent, or Firm*—Global IP Services PLLC; Prakash Nama

(57) ABSTRACT

A group metering method (and system) for monitoring electrical energy consumption by a plurality of proximate users replaces multiple individual user-meters by a single electronic meter. A single computational engine computes consumed energy values by the users and deploys a single subsection set (display, real time clock, and non-volatile memory) which can be located on a PCB. The system, usable for single or three phase, may be located out of reach from the users to make it tamper proof. Individual ADCs obtain electrical current values (through current transformers,) of power consumed by individual users and cooperate with a single DSP to compute energy consumption by individual users, readable on a common display in round robin fashion. Differences between the sum of energy values consumed by the users and a consolidated energy reading beyond a known threshold are reported as possible user-tampering. Asynchronous communication ports communicate with display units and AMR modules.

15 Claims, 2 Drawing Sheets

US 7,236,897 B2

GROUP METERING SYSTEM FOR POWER METERS

RELATED APPLICATION

Benefit is claimed under 35 U.S.C. 119(e) to U.S. Provisional Application Ser. No. 60/600,232, entitled "Group Metering System for Power Meters" by Guljeet S. Gandhi, filed Aug. 10, 2004, which is herein incorporated in its entirety by reference for all purposes.

FIELD OF THE INVENTION

This invention generally relates to power/energy meters in general, and in particular to a group electronic metering system for a plurality of consumers/users who may be proximate to each other.

BACKGROUND OF THE INVENTION

It is known that separate power/energy meters are generally installed for each consumer and/or house hold by the utility company or electricity provider. Even when the houses are in close proximity, separate power meters are required to ensure that the consumption by each consumer is properly accounted. Power meters are a capital expense for the utility and if possible, utilities would like to reduce this capital expense. Electronic energy meters are known in the art and have distinct advantages in terms of cost, size and ease of installation. Information pertaining to electronic energy meters is available in prior art. Examples of some prior art publications relating to energy meters include: (i) Publication in Metering Asia Pacific conference, 20–22 Feb. 2001 conference Documentation, titled "Exceeding 60 year Life expectancy from an Electronic Energy Meter, by Natasha Wan and Kevin Manning of Analog Devices, Wilmington, Mass. 01887, and (ii) Publication in Solid State solutions for Electricity and Metrology, entitled Metering & Tariffs for Energy Supply, 25–28 May 1999, Conference Publication No 462 IEEE 1999, by A. Collins, of Analog Devices Inc, Wilmington, Mass. 01887.

Currently, electrical energy consumers are provided with individual power meters (electromechanical or electronic power meter). Power meters are primarily classified in to two categories, single phase meters and three phase meters. The present invention is applicable to single phase and three phase electronic energy metering. Generally, each single phase electronic energy meter uses a separate Application Specific Integrated Circuit (ASIC) or micro-controller based computational engine. Each prior art single phase electronic energy meter also has subsections such as a separate power supply, LCD display, Real Time Clock (RTC), Non-volatile memory, etc., which are essentially replication of sections for each meter. It is desirable to address the issues of economy and possibility of reducing tampering by consumers, in electrical energy meters provided for users who are particularly proximate to each other.

SUMMARY OF THE INVENTION

This invention provides an electronic group metering system, for metering consumers or residences that are preferably located in close proximity. Instead of having multiple power meters in each consumer's premises, the group metering system offers an integrated solution, replacing multiple meters and thus reducing the high amount of replication and therefore, the overall cost of the electronic hardware. The group metering system is also cost effective because the cost of the communication modules that are required for automatic meter reading (AMR) gets divided, and the effective cost per consumer can be very small. The group metering system not only addresses these problems but also offers ease of operation, deployment, and maintenance. The method and configuration in the present invention are applicable to single phase and three phase energy meters.

The present invention focuses on having one single computational engine for all channels and using a single subsection set mentioned above. Thus, multiple power meters can be grouped and packaged into one single printed circuit board. It is possible to configure the group metering system using software for functioning as multiple meters. The present invention also minimizes the possibility of consumer-tampering of the metering unit since multiple meters are combined into one group and also can be located out of the reach from a consumer.

In the present group metering system that has been developed for grouping multiple power meters into one unit, the grouped multiple power meters can have one single LCD display to show the power consumptions in a round robin or cyclic mode as desired.

One embodiment of the invention resides in a method of individually monitoring electrical energy consumption by a plurality of users connected to a single main power supply source, comprising the steps of: deriving electrical current values of power consumption by said users; converting said electrical current values and a voltage from said main power supply into digital values; digitally processing said digital values for each user by using a common digital signal processor (DSP) over a known number of cycles to obtain consumed energy values for each user; and, monitoring said consumed energy values for each user by using a subsection set that is common to all said users. Typically, a subsection set might include an LCD display, real time clock, and non-volatile memory, all of which can be located on a PCB. The subsection set might include other components which would assist the metering operation.

A second embodiment resides in an electronic metering arrangement for individually monitoring electrical energy consumption by a plurality of proximate users connected to a common main power supply source, said metering arrangement being common to and shared by all said users, said metering arrangement comprising: means to derive separate electrical phase current values of power consumption by said users; analog to digital converter means (ADCs) for converting said separate electrical phase current values to digital current values; a common DSP configured for deriving values of electrical energy consumed by each user from said digital current values and a voltage of said main power supply source over a desired time period, said arrangement including a single subsection set that is common to all said users.

The main power supply source is preferably single phase, and the single subsection set selectively includes a real time clock (RTC), an LCD (liquid crystal display) and a non-volatile memory. Expediently, the metering arrangement is disposed out of reach of said consumers/users.

Another embodiment resides in a method of individually monitoring electrical energy consumption by a plurality of proximate users all connected to a common single main power supply source, comprising the steps of: deriving individual electrical current values of power consumption by each of said users; converting said electrical current values and a voltage value of said main power supply source into digital values for each user by using separate ADCs; digitally processing said digital values for each user over a known time period to obtain consumed energy values for each user by using a common DSP; and, simultaneously monitoring said consumed energy values for each user by using a single subsection set that is common to all said users.

In one exemplary embodiment, the group metering system of the present invention includes a chipset which is a combination of DSP and 4 pieces of 6-channel simultaneous sampling sigma-delta ADCs. Also provided are two asynchronous communication ports to communicate with display units or AMR modules. The group metering system of the present invention has an in-built summation meter to calculate the total energy used by all consumers in the group and also compares with the sum of the consumptions registered by each meter to flag an error if there is a difference between the two readings by a certain percentage.

The calibration for all the meters is done simultaneously and thus saves a significant amount of production time. The phase shift and non-linearity in the current transformers (CT) are expediently compensated using software.

BRIEF DESCRIPTION OF THE DRAWING

A more detailed understanding of the invention maybe had from the following description of a preferred embodiment, given by way of example and not limitation, to be understood in conjunction with the accompanying drawing wherein.

DETAILED DESCRIPTION

In the following detailed description of an exemplary embodiment of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims and their equivalents.

Figure 1:
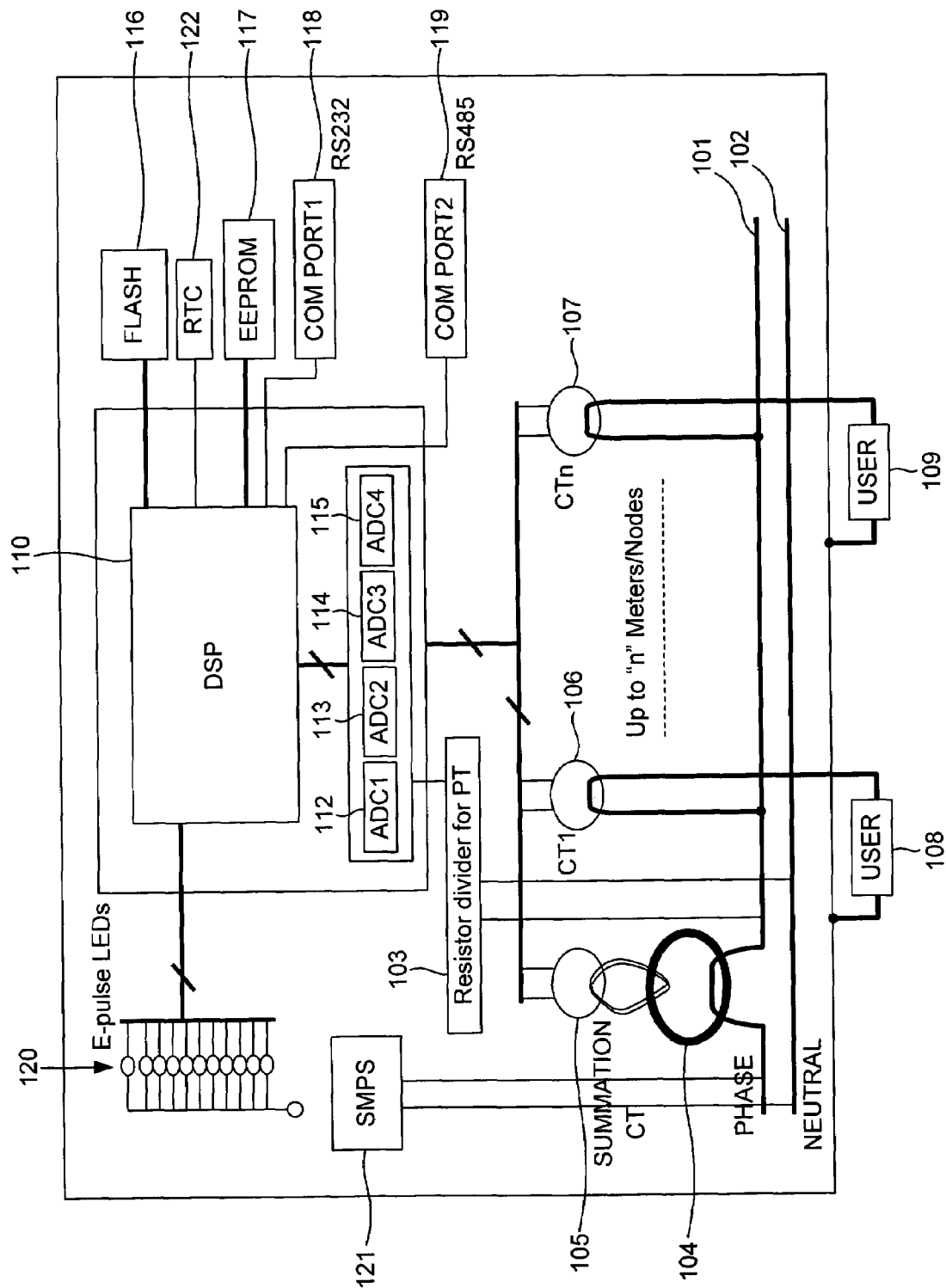
FIG. 1 is a block diagram of an exemplary group metering system using the present invention; and, FIG. 2 illustrates a general purpose computing platform that can be used in the practice of the invention.

FIG. 1 shows the block diagram of an embodiment of the group metering system. The phase (101) and neutral (102) lines are conductors coming from the secondary of a step-down transformer. A potential divider block (103) scales this voltage to lower levels. The main conductor bringing in the phase line passes through a step-down current transformer (104) and the secondary of this is fed to another current transformer (105). From the main phase conductor, individual tappings pass through current transformers such as 106 and 107 and are sent to the individual consumers, identified in the diagram as 108 and 109. There can be multiple such consumers as 108 or 109 connected to the main phase line. A burden resistor connected to the secondary of these current transformers converts the current into voltage, which is then fed to individual channels of the ADCs 112, 113, 114 and 115. Each Analog to Digital converter which may be an integrated circuit, has 6-simultaneous sampling channels. The signal from the potential divider block (103) provides the potential or voltage across the phase and the neutral and the signals from burden resistors connected across the current transformers (105, 106 and 107) provides a signal proportional to the current passing through the current transformers or current signals. The ADCs 112, 113, 114 and 115 are daisy chained and connected to a digital signal processor (110). In one exemplary embodiment, using 4 Analog to digital converter integrated circuits, the scheme can provide up to 24 channels for acquiring data. One channel is used for sensing the potential through the potential divider (103); a second channel is used for sensing the current for the summation CT (105) and the remaining multiple channels are used for sensing the current going to multiple different or individual consumers. Expediently, the digital signal processor has its firmware residing in the flash memory (116). The digital signal processor (110) multiplies the potential signal with the each current signal to compute the instantaneous active power. This active power is integrated over an integral number of mains cycles (power line cycles) to compute the active energy values. The potential signal and the current signal from the current transformer 105 gives the active energy of the summation meter, which provides the overall consumption of all the meters. The potential signal and the current signal from the current transformers 106 and 107 provide the active energy consumed by each individual consumer or user. The digital signal processor 110 provides pulses proportional to the power consumed by each individual consumer (108 and 109) on an array of LEDs (120). The computed energy values are stored in the non-volatile memory marked EEPROM (117) periodically and on blackout. Using the active energy for each individual meter or consumer, the digital signal processor computes the maximum demand over a pre-configured integration period. The maximum demand along with the date and time stamp acquired from the real time clock (RTC) (122) is also stored in the EEPROM (117). The complete circuitry is powered using an on-board switched mode power supply (121).

The whole scheme thus provides one main summation meter and multiple sub-meters.

The individual active energy values are totaled in a separate register and compared frequently with active energy calculated in the summation meter. The variance in the comparison of these two values is flagged as an error if less than a limit, or, if excessive, as a tamper.

The calibration for all the sub-meters can be performed substantially simultaneously using a group metering calibration software with the help of a programmable current and voltage source.

The phase and non-linearity compensation on current transformers 105, 106 and 107 are performed by the digital signal processor. There are no trim potentiometers needed for calibration, thus saving significant production time.

The DSP has two synchronous communication ports (118 and 119) and are used as RS-232 and RS-485 respectively to be able to communicate with the display unit and/or AMR modules.

The following features are noted in the context of the scheme in the described embodiment:
1. The group meter system preferably but not necessarily uses one single computational engine to register power consumption for multiple consumers.
2. The method of daisy chaining multiple analog-to digital converters and feeding the data to the computational engine enables feature 1 above to be implemented.
3. The computational engine can compute the active power and energies for multiple meters simultaneously.

4. The scheme can save the cost of having individual sub-systems such as power supplies, non-volatile memory, real time clock, communication line drivers, LCDs for display, etc.
5. The scheme also enables the utility to have one main meter called summation meter and also have multiple sub-meters on the same PCB
6. The scheme provides the ability to connect one single AMR module, such as GSM Modems, PLC, or RF to communicate the data from multiple meters without the need for an additional concentrator.
7. The scheme also provides the ability to calibrate multiple meters at the same time using the software, thus reducing the production cost.
8. The individual active energies are totaled in a separate register and compared frequently with active energy calculated in the summation meter. The variance in the comparison of these two values is flagged as an error or tamper.
9. The phase and non-linearity compensation (patent pending) on current transformers (CTs) is carried out with the help of software, and no trim potentiometer is required to be used.
10. It is possible to configure the system for any number of power meter units.
11. The scheme provides a tamper-proof system, since the unit can be installed at a height not easily accessible normally to a user.
12. The scheme also provides a communication port to connect one display unit to all the meters, thus saving cost.

Various embodiments of the present subject matter can be implemented in software, which may be run in the environment shown in FIG. 2 (to be described below) or in any other suitable computing environment. The embodiments of the present subject matter are operable in a number of general-purpose or special-purpose computing environments. Some computing environments include personal computers, general-purpose computers, server computers, hand-held devices (including, but not limited to, telephones and personal digital assistants (PDAs) of all types), laptop devices, multi-processors, microprocessors, set-top boxes, programmable consumer electronics, network computers, minicomputers, mainframe computers, distributed computing environments and the like to execute code stored on a computer-readable medium. The embodiments of the present subject matter may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Figure 2:
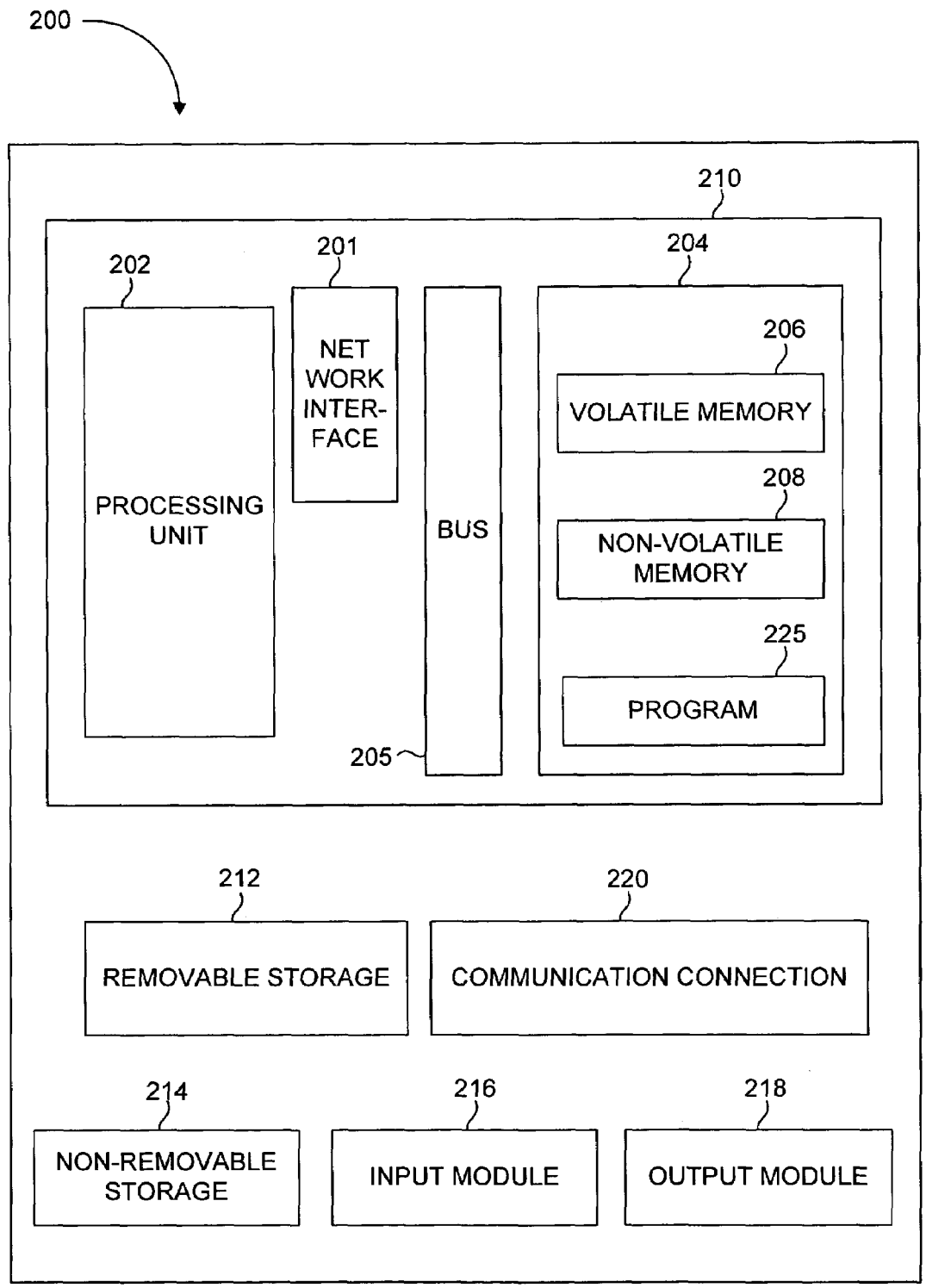

FIG. 2 shows an example of a suitable computing system environment for implementing embodiments of the present subject matter. FIG. 2 and the following discussion are intended to provide a brief, general description of a suitable computing environment in which certain embodiments of the inventive concepts contained herein may be implemented.

A general computing device, in the form of a computer 210, may include a processing unit 202, memory 204, removable storage 212, and non-removable storage 214. Computer 210 additionally includes a bus 205 and a network interface (NI) 201.

Computer 210 may include or have access to a computing environment that includes one or more user input devices 216, one or more output devices 218, and one or more communication connections 220 such as a network interface card or a USB connection. The one or more user input devices 216 can be a touch screen and a stylus and the like. The one or more output devices 218 can be a display device of computer, computer monitor, TV screen, plasma display, LCD display, display on a touch screen, display on an electronic tablet, and the like. The computer 210 may operate in a networked environment using the communication connection 220 to connect to one or more remote computers. A remote computer may include a personal computer, server, router, network PC, a peer device or other network node, and/or the like. The communication connection may include a Local Area Network (LAN), a Wide Area Network (WAN), and/or other networks.

The memory 204 may include volatile memory 206 and non-volatile memory 208. A variety of computer-readable media may be stored in and accessed from the memory elements of computer 210, such as volatile memory 206 and non-volatile memory 208, removable storage 212 and non-removable storage 214. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like, chemical storage, biological storage, and other types of data storage.

"Processor" or "processing unit," as used herein, means any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like.

Embodiments of the present subject matter may be implemented in conjunction with program modules, including functions, procedures, data structures, application programs, etc., for performing tasks, or defining abstract data types or low-level hardware contexts.

Machine-readable instructions stored on any of the above-mentioned storage media are executable by the processing unit 202 of the computer 210. For example, a computer program 225 may include machine-readable instructions capable of implementing group metering method and system as described with reference to embodiments of the present subject matter. In one embodiment, the computer program 225 may be included on a CD-ROM and loaded from the CD-ROM to a hard drive in non-volatile memory 208. The machine-readable instructions cause the computer 210 to decode according to the various embodiments of the present subject matter.

In the foregoing detailed description of embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled.

The invention claimed is:

1. A method of individually monitoring electrical energy consumption by a plurality of users connected to a single main power supply source, comprising the steps of:
deriving electrical current values of power consumption by said users;
converting said electrical current values and a voltage from said main power supply into digital values;
digitally processing said digital values for each user by using a common digital signal processor (DSP) over a known number of cycles to obtain consumed energy values for each user; and,
monitoring said consumed energy values for each user by using a subsection set that is common to all said users, said method being configured by software as a group metering system, and including the step of separately measuring total energy consumption simultaneously by all said users in a single measurement.

2. The method as in claim 1, wherein the step of separately measuring total energy consumption simultaneously by all said users in a single measurement is done by using said common DSP.

3. The method as in claim 2, including the step of performing comparison of a consumed energy value from said single measurement with a summation value of consumed energy values from all said users, and accepting said monitoring if said comparison shows an error difference less than a predetermined energy value.

4. The method as in claim 3, including the step of reporting possible user-tampering if said comparison shows an error difference more than a predetermined energy value.

5. An electronic metering arrangement for individually monitoring electrical energy consumption by a plurality of proximate users connected to a common main power supply source, said metering arrangement being common to and shared by all said users, said metering arrangement comprising:
current sensors to derive separate electrical phase current values of power consumption by said users;
analog/digital converter means (ADCs) for converting said separate electrical phase current values to digital current values;
a common digital signal processor (DSP) configured for deriving values of electrical energy consumed by each user from said digital current values and a voltage of said main power supply source over a desired time period, said arrangement including a single subsection set that is common to all said users, the electronic metering arrangement including means for performing a comparison of a single combined value of consumed energy for all users with a summation of values of consumed energy for different users, and accepting said monitoring if said comparison shows an error difference less than a predetermined energy value.

6. The metering arrangement of claim 5, including means for reporting possible user-tampering if said comparison shows an error difference more than a predetermined energy value.

7. An electronic metering arrangement for individually monitoring electrical energy consumption by a plurality of proximate users connected to a common main power supply source, said metering arrangement being common to and shared by all said users, said metering arrangement comprising:
means to derive separate electrical phase current values of power consumption by said users;
analog/digital converter means (ADCs) for converting said separate electrical phase current values to digital current values; and,
a common digital signal processor (DSP) configured for deriving values of electrical energy consumed by each user from said digital current values and a voltage of said main power supply source over a desired time period, said arrangement including a single subsection set that is common to all said users, including a display unit for selectively showing energy consumption values at any desired time, the metering arrangement being configured for accepting selective calibration of said subsection set and said display, wherein said means to derive separate electrical current values includes current transformers (CTs), said metering arrangement including means using software for compensating phase shift and nonlinearity in said CTs.

8. An electronic metering arrangement for individually monitoring electrical energy consumption by a plurality of proximate users connected to a common main power supply source, said metering arrangement being common to and shared by all said users, said metering arrangement comprising:
means to derive separate electrical phase current values of power consumption by said users;
analog/digital converter means (ADCs) for converting said separate electrical phase current values to digital current values; and,
a common digital signal processor (DSP) configured for deriving values of electrical energy consumed by each user from said digital current values and a voltage of said main power supply source over a desired time period, said arrangement including a single subsection set that is common to all said users, the metering arrangement including an on-board switched power supply connected for powering said monitoring, wherein said common DSP and said subsections are incorporated into a common printed circuit board (PCB), wherein the PCB includes a chip-set which is a combination of said DSP and six channels simultaneously sampling sigma-delta analog to digital converters wherein the ADCs are daisy chained and connected to said DSP.

9. An electronic metering arrangement for individually monitoring electrical energy consumption by a plurality of proximate users connected to a common main power supply source, said metering arrangement being common to and shared by all said users, said metering arrangement comprising:
means to derive separate electrical phase current values of power consumption by said users;

analog/digital converter means (ADCs) for converting said separate electrical phase current values to digital current values; and, a common digital signal processor (DSP) configured for deriving values of electrical energy consumed by each user from said digital current values and a voltage of said main power supply source over a desired time period, said arrangement including a single subsection set that is common to all said users, wherein said main power supply source is single phase and wherein said single subsection set selectively includes a real time clock (RTC), an LCD (liquid crystal display) and a nonvolatile memory, said metering arrangement being disposed out of reach by said users, wherein a maximum power demand along with a corresponding date and time acquired from said RTC is stored in an EEPROM (electrically erasable programmable read only memory).

10. An electronic metering arrangement for individually monitoring electrical energy consumption by a plurality of proximate users connected to a common main power supply source, said metering arrangement being common to and shared by all said users, said metering arrangement comprising:

means to derive separate electrical phase current values of power consumption by said users;

analog/digital converter means (ADCs) for converting said separate electrical phase current values to digital current values; and, a common digital signal processor (DSP) configured for deriving values of electrical energy consumed by each user from said digital current values and a voltage of said main power supply source over a desired time period, said arrangement including a single subsection set that is common to all said users, the metering arrangement including an on-board switched power supply connected for powering said monitoring, wherein said common DSP and said subsections are incorporated into a common printed circuit board (PCB), wherein the PCB includes a chip-set which is a combination of said DSP and six channels simultaneously sampling sigma-delta analog to digital converters, including a main summation meter and multiple sub-meters on a common PCB.

11. The metering arrangement as in claim 10, including a communication port to connect a common display unit selectively to be connected to said summation meter and said multiple sub-meters.

12. An electronic metering arrangement for individually monitoring electrical energy consumption by a plurality of proximate users connected to a common main power supply source, said metering arrangement being common to and shared by all said users, said metering arrangement comprising:

means to derive separate electrical phase current values of power consumption by said users;

analog/digital converter means (ADCs) for converting said separate electrical phase current values to digital current values;

a common digital signal processor (DSP) configured for deriving values of electrical energy consumed by each user from said digital current values and a voltage of said main power supply source over a desired time period, said arrangement including a single subsection set that is common to all said users, including a display unit for selectively showing energy consumption values at any desired time; and, including synchronous communication ports configured to communicate with said display unit or other automatic meter reading module (AMR), including means to connect a single AMR to a GSM modem, PLC or RF to communicate data from multiple meters without need for an additional concentrator.

13. A method of individually monitoring electrical energy consumption by a plurality of proximate users all connected to a common single main power supply source, comprising the steps of:

deriving individual electrical current values of power consumption by each of said users;

converting said electrical current values and a voltage value of said main power supply source into digital values for each user by using separate analog to digital converters (ADCs);

digitally processing said digital values for each user over a known time period to obtain consumed energy values for each user by using a common digital signal processor (DSP); and, simultaneously monitoring said consumed energy values for each user by using a single subsection set that is common to all said users; said method being configured by software as a group metering system, including the step of separately measuring total energy consumption simultaneously by all said users in a single measurement.

14. The method as in claim 13, including the step of performing comparison of a consumed energy value from said single measurement with a summation value of consumed energy values from all said users, and accepting said monitoring if said comparison shows an error difference less than a predetermined energy value.

15. The method as in claim 14, including the step of reporting possible user-tampering if said comparison shows an error difference more than a predetermined energy value.

* * * * *